(12) United States Patent
Halawani et al.

(10) Patent No.: US 12,665,613 B2
(45) Date of Patent: Jun. 23, 2026

(54) SELF-CLOCKING SIGNAL PROTOCOL

(71) Applicant: Allegro MicroSystems, LLC, Manchester, NH (US)

(72) Inventors: Ahmad Nour Halawani, Heidelberg (DE); Emil Pavlov, Heidelberg (DE)

(73) Assignee: Allegro MicroSystems, LLC, Manchester, NH (US)

( * ) Notice: Subject to any disclaimer, the term of this patent is extended or adjusted under 35 U.S.C. 154(b) by 80 days.

(21) Appl. No.: 18/662,044

(22) Filed: May 13, 2024

(65) Prior Publication Data

US 2025/0350299 A1 Nov. 13, 2025

(51) Int. Cl.
| | |
|---|---|
| *H03M 7/30* | (2006.01) |
| *G06F 1/08* | (2006.01) |
| *G06F 1/12* | (2006.01) |

(52) U.S. Cl.
CPC ............. *H03M 7/6011* (2013.01); *G06F 1/08* (2013.01); *G06F 1/12* (2013.01)

(58) Field of Classification Search
CPC ........... H03M 7/6011; G06F 1/08; G06F 1/12
See application file for complete search history.

(56) References Cited

U.S. PATENT DOCUMENTS

| | | |
|---|---|---|
| 6,815,944 B2 | 11/2004 | Vig et al. |
| 7,026,808 B2 | 4/2006 | Vig et al. |
| 8,577,634 B2 | 11/2013 | Donovan et al. |
| 8,624,588 B2 | 1/2014 | Vig et al. |

| | | |
|---|---|---|
| 8,994,369 B2 | 3/2015 | Vig et al. |
| 9,151,771 B2 | 10/2015 | Vig et al. |
| 9,664,748 B2 | 5/2017 | Friedrich et al. |
| 10,156,461 B2 | 12/2018 | Snyder et al. |
| 10,216,559 B2 | 2/2019 | Fernandez |
| 10,436,606 B2 | 10/2019 | Kerdraon et al. |
| 10,473,486 B2 | 11/2019 | Doogue et al. |
| 10,480,957 B2 | 11/2019 | Kerdraon et al. |
| 10,481,218 B2 | 11/2019 | Prentice et al. |
| 10,495,485 B2 | 12/2019 | Burdette et al. |
| 10,495,700 B2 | 12/2019 | Prentice et al. |
| 10,571,301 B2 | 2/2020 | Doogue et al. |
| 10,598,514 B2 | 3/2020 | Pepka et al. |
| 10,656,170 B2 | 5/2020 | Lim et al. |
| 10,747,708 B2 | 8/2020 | Kozomora et al. |
| 10,782,366 B2 | 9/2020 | Stewart |

(Continued)

OTHER PUBLICATIONS

U.S. Appl. No. 18/502,259, filed Nov. 6, 2023, Halawani et al.
U.S. Appl. No. 18/435,241, filed Feb. 7, 2024, Rivas et al.
U.S. Appl. No. 18/430,740, filed Feb. 2, 2024, Hein et al.

*Primary Examiner* — Mohamed Barakat
(74) *Attorney, Agent, or Firm* — Daly, Crowley, Mofford & Durkee, LLP

(57) ABSTRACT

A signal encoding and decoding protocol to transmit both clock information and a data payload in a single line is disclosed. Data may be encoded in a unipolar non-return-to-zero line in which an initial pulse width determines a clock frequency, followed by a series of pulses indicating the data payload. Each clock transition following an initial synchronization pulse indicates a data bit in which the value of the bit is determined in relation to the previous bit. Edge information may indicate a change in bit value from the previous bit. If the transmission signal remains at the same level for a subsequent clock period, the bit value remains the same.

25 Claims, 5 Drawing Sheets

(56) References Cited

U.S. PATENT DOCUMENTS

| 11,194,004 | B2 | 12/2021 | Scheller et al. | |
| 11,686,597 | B2 | 6/2023 | Weiland et al. | |
| 2002/0118036 | A1* | 8/2002 | Simon | H03K 5/06 |
| | | | | 326/29 |
| 2007/0230648 | A1* | 10/2007 | Gupta | H04L 7/033 |
| | | | | 375/371 |
| 2007/0274424 | A1* | 11/2007 | Lloyd | H04J 3/0605 |
| | | | | 375/371 |
| 2011/0119475 | A1* | 5/2011 | Chen | G06F 1/08 |
| | | | | 713/400 |
| 2011/0215842 | A1* | 9/2011 | Jain | H03K 23/68 |
| | | | | 327/115 |
| 2015/0281808 | A1* | 10/2015 | Shinchi | H04Q 9/00 |
| | | | | 340/870.39 |
| 2023/0378977 | A1 | 11/2023 | Bastien et al. | |
| 2023/0400477 | A1 | 12/2023 | Friedrich et al. | |
| 2024/0426862 | A1 | 12/2024 | Dono et al. | |
| 2025/0062758 | A1* | 2/2025 | Mishra | H03K 5/249 |

* cited by examiner

500

502

Capture signal

504

Receive a clock signal having a period

506

Generate an initial pulse having a width indicative of the period

508

Generate a series of pulses indicative of one or more data bit values

510

Transmit signal

512

Receive signal

514

Decode signal

SELF-CLOCKING SIGNAL PROTOCOL

FIELD OF TECHNOLOGY

The present disclosure relates to signal processing and, more particularly, to a self-clocking transmission signal protocol to convey information utilizing a full bit rate.

BACKGROUND

As is known, sensors are used in various types of devices to measure and monitor properties of systems in a wide variety of applications. For example, sensors have become common in products that rely on electronics in their operation, such as automotive control systems. Examples of automotive applications are detection of wheel speed for antilock braking systems and four-wheel steering systems, and the speed and direction of transmission gears.

Sensor output signals are encoded into signals that can be conveyed across systems where they are then decoded and processed accordingly. Encoding analog and digital signals relies on modulation techniques to alter the properties of waveforms thereby encoding information one or more output signals. Local clocks on the encoder and decoder must be in sync to accurately transmit and receive data back and forth. To synchronize the clocks, many signal protocols require a separate clock signal to be transmitted with a data signal, where timing information is sent on the separate clock signal line. Some signal protocols, such as the Manchester protocol, are self-clocking (i.e., the signal may be decoded without a separate clock signal), however these signals only convey information using one half of the bit rate (i.e., on every second clock transition) and they occupy significant bandwidth due to the transmission of both the clock information and the data.

SUMMARY

Aspects of the present disclosure relate generally to a signal encoding and decoding protocol to convey information in a transmission signal including both clock information and a data payload in a single line. Data may be encoded in a unipolar non-return-to-zero line in which an initial pulse width conveys a clock frequency, followed by a series of pulses indicating the data payload. Each clock transition following an initial synchronization pulse may indicate a data bit in which the value of the bit is determined in relation to the previous bit. Edge information may indicate a change in bit value from the previous bit. If the transmission signal remains at the same level for a subsequent clock period, the bit value remains the same.

According to one aspect, an apparatus may include a clock signal generator configured to generate a clock signal having a period and a processor responsive to the clock signal generator and configured to generate an encoded signal. The encoded signal may include a first pulse having a width representative of the period of the clock signal followed by data bits. Each edge of the clock signal may be associated with a different data bit and the encoded signal may include edge information indicative of a value of the data bit.

The apparatus may further include, alone or in combination, one or more of the following features. The encoded signal may be at a low level after the first pulse and before the data bits. The edge information may include a presence of a rising edge, a presence of a falling edge, or an absence of an edge. The presence of a rising edge may be indicative of a first change in the value of a data bit from a first value to a second value. The presence of a falling edge may be indicative of a second change in the value of a data bit from the second value to the first value. The first value may be '0' and the second value is '1'. The absence of an edge may be indicative of a first bit and a second, consecutive bit having the same value. At least one sensing element may be operable to generate and transmit at least one sensor signal to the processor. The at least one sensing element may include one or more of a magnetic field sensing element, an inductive sensing element, a resistive sensing element, an optical sensing element, a pressure sensing element, a motor control element, or a temperature sensing element. The at least one sensing element may include a magnetic field sensing element operable to generate the at least one sensor signal where the at least one sensor signal may be indicative of a magnetic field associated with an object.

A decoder may be operable to decode the encoded signal to determine the value of each data bit. The decoder may be configured to measure the width of the first pulse and store a period of a decoder clock signal represented by the width of the first pulse. A first time interval may be determined from the first pulse to a first rising edge following the first pulse. A first number of equal consecutive bit values may be calculated by dividing the first time interval by the period to determine a quotient. A first bit value of one may be determined for each of the first number of equal consecutive bit values if the quotient is equal to one. The first bit value of zero may be determined for each of the first number of equal consecutive bit values if the quotient is greater than one. A first updated period of the decoder clock signal may be determined based on a time of the first rising edge and the first number of consecutive bit values. A second time interval may be determined from an end of the first time interval to a proximate signal edge. A second number of equal consecutive bit values may be calculated by dividing the second time interval by the first updated period of the of the decoder clock signal. A second bit value of one may be determined for each of the second number of equal consecutive bit values if a prior transition was a rising edge. The second bit value of zero may be determined for each of the second number of equal consecutive bit values if the prior transition was a falling edge. A second updated period may be generated based on the time of the proximate signal edge and the second number of consecutive bit values. The first updated period may be determined by dividing the time of the first rising edge by the first number of consecutive bit values. The second updated period may be determined by dividing the time of the proximate signal edge by the second number of consecutive bit values.

According to another aspect, a method of communicating a signal may include receiving a clock signal having a period, receiving a data signal including data bits and generating an encoded signal comprising a first pulse having a width representative of the period of the clock signal followed by one or subsequent pulses representative of the data bits. Each edge of the clock signal may be associated with a different data bit and wherein the one or more subsequent pulses comprise edge information indicative of a value of the data bit.

The method may include, alone or in combination, one or more of the following features. The apparatus may further include one or more of the following features. The encoded signal may be at a low level after the first pulse and before the data bits. The edge information may include a presence of a rising edge, a presence of a falling edge, or an absence of an edge. The presence of a rising edge may be indicative of a first change in the value of a data bit from a first value to a second value. The presence of a falling edge may be indicative of a second change in the value of a data bit from the second value to the first value. The first value may be '0' and the second value is '1'. The absence of an edge may be indicative of a first bit and a second, consecutive bit having the same value. At least one sensor signal may be received from at least one sensing element may be operable to generate and transmit at least one sensor signal to the processor.

The encoded signal may be decoded to determine the value of each data bit. The width of the first pulse may be measured, and a period of a decoder clock signal represented by the width of the first pulse may be stored. A first time interval may be determined from the first pulse to a first rising edge following the first pulse. A first number of equal consecutive bit values may be calculated by dividing the first time interval by the period to determine a quotient. A first bit value of one may be determined for each of the first number of equal consecutive bit values if the quotient is equal to one. The first bit value of zero may be determined for each of the first number of equal consecutive bit values if the quotient is greater than one. A first updated period of the decoder clock signal may be determined based on a time of the first rising edge and the first number of consecutive bit values. A second time interval may be determined from an end of the first time interval to a proximate signal edge. A second number of equal consecutive bit values may be calculated by dividing the second time interval by the first updated period of the of the decoder clock signal. A second bit value of one may be determined for each of the second number of equal consecutive bit values if a prior transition was a rising edge. The second bit value of zero may be determined for each of the second number of equal consecutive bit values if the prior transition was a falling edge. A second updated period may be generated based on the time of the proximate signal edge and the second number of consecutive bit values. The first updated period may be determined by dividing the time of the first rising edge by the first number of consecutive bit values. The second updated period may be determined by dividing the time of the proximate signal edge by the second number of consecutive bit values.

According to another aspect, a decoding apparatus may include a clock and a processor responsive to the clock and configured to receive an encoded signal comprising a first pulse followed by one or more subsequent pulses. The processor may be configured to decode the encoded signal by measuring a width of the first pulse of the encoded signal, storing the width of the first pulse as a decoder clock period, and determining a first time interval from the first pulse to a first rising edge following the first pulse. A first number of equal consecutive bit values may be calculated by dividing the first time interval by the period to determine a quotient. A first bit value of one may be determined for each of the first number of equal consecutive bit values if the quotient is equal to one. The first bit value of zero may be determined for each of the first number of equal consecutive bit values if the quotient is greater than one. A first updated period of the decoder clock may be determined based on a time of the first rising edge and the first number of consecutive bit values. A second time interval may be determined from an end of the first time interval to a proximate signal edge. A second number of equal consecutive bit values may be calculated by dividing the second time interval by the first updated period of the of the decoder clock. A second bit value of one may be determined for each of the second number of equal consecutive bit values if a prior transition was a rising edge. The second bit value of zero may be determined for each of the second number of equal consecutive bit values if the prior transition was a falling edge. A second updated period may be generated based on the time of the proximate signal edge and the second number of consecutive bit values.

The apparatus may further include, alone or in combination, one or more of the following. The first updated period may be determined by dividing the time of the first rising edge by the first number of consecutive bit values. The second updated period may be determined by dividing the time of the proximate signal edge by the second number of consecutive bit values.

It is appreciated that the concepts, techniques, and structures disclosed herein may be embodied in other ways, and that the above summary of disclosed embodiments is thus meant to be illustrative rather than comprehensive or limiting. In particular, individual elements of different embodiments described herein may be combined to form other embodiments not specifically set forth above. Various elements, which are described in the context of a single embodiment, also may be provided in other embodiments separately, or in any suitable subcombination. Moreover, other embodiments not specifically described herein also may be within the scope of the claims set forth below.

BRIEF DESCRIPTION OF THE DRAWINGS

The foregoing features of the disclosure, as well as the disclosure itself may be more fully understood from the following detailed description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

Aspects of the present disclosure relate generally to a signal encoding and decoding protocol to transmit both clock information and a data payload in a single line. Data may be encoded in a unipolar non-return-to-zero line in which an initial pulse width defines a clock frequency, followed by a series of pulses indicating the data payload. Accordingly, the transmission signal may be generated whereby the bit value '0' may be defined by a zero voltage (i.e. low-level) and the bit value '1' (i.e., high-level) may be defined by a positive voltage. Further, the transmission signal may not return to zero while in the middle of a bit.

According to one or more aspects, as detailed below, each transition following an initial synchronization pulse may indicate a data bit in which the value of the bit is conveyed and determined in relation to the previous bit, (i.e., a change in the amplitude at a clock transition indicates a change from one bit value to another). The transmission signal may be defined according to the protocol by one or more conditions, including, for example: a rising edge indicates a previous bit was '0' and the current bit is '1'; a falling edge indicates the previous bit was '1' and the current bit is '0'; and no data transition (i.e., a pulse extending longer than a clock cycle) indicates the current bit value is the same as the previous one. One skilled in the art will recognize the polarities of the bits determined by the pulse edges may also be reversed.

Figure 1:
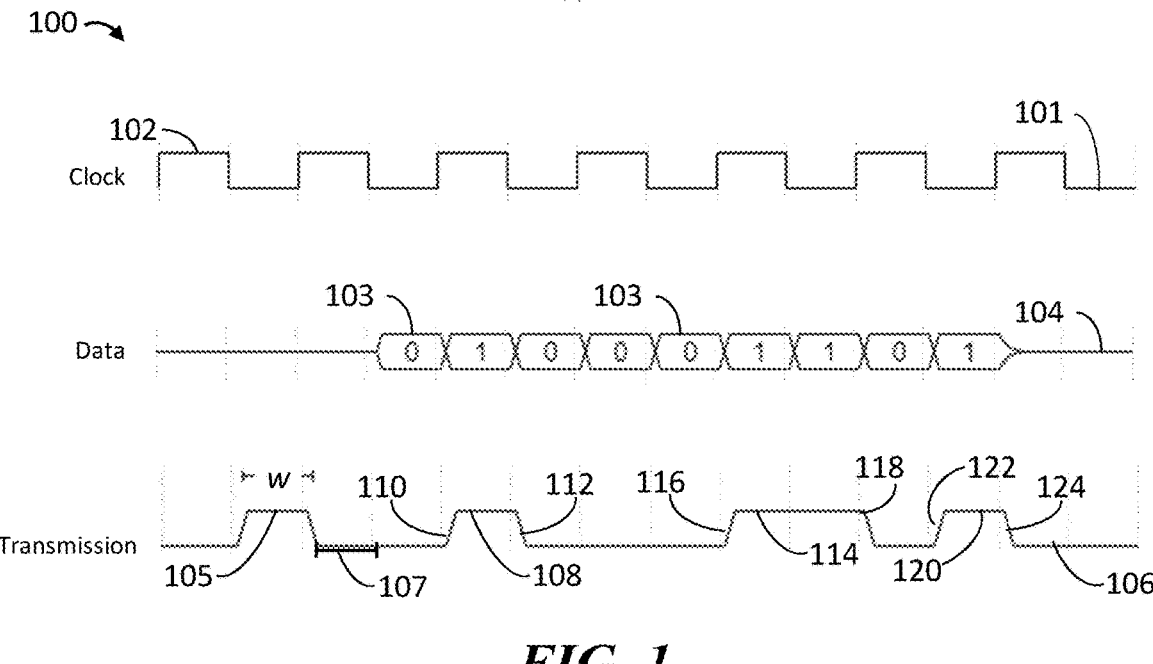
FIG. 1 is a timing diagram of a compact modulation protocol signal, according to aspects of the disclosure.

FIG. 1 is a timing diagram 100 of a transmission signal 106 generated according to a signal protocol, referred to herein as a "compact modulation protocol," according to aspects of the present disclosure. As used herein, a compact modulation protocol may be a modulation protocol for encoding and decoding data in a transmission signal that includes a clock frequency and a data payload wherein each clock transition conveys a data bit where each bit is encoded in relation to the previous bit.

According to one aspect, the compact modulation protocol may include timing information from a clock signal 101 and a data payload defined by a data signal 104. The clock signal 101 may include pulses 102 having a width defining a clock frequency or period. The data signal 104 may include a number of data bits, collectively labeled 103, that make up a data payload for inclusion in the transmission signal 106. For example, the data signal 104 of FIG. 1 may include a data payload with a sequence of data bits: '010001101'. According to one aspect, the clock information and the data payload may be encoded into the transmission signal 106 such that, when decoded, the receiver may be configured to synchronize the decoder's clock with the encoder's clock as well as read and process the data payload from a single transmission line.

According to one aspect, the compact modulation protocol may generate the transmission signal 106 to include an initial pulse 105 indicative of a clock period followed by a number of pulses, for example pulses 108, 114, and 120 in which edge information, or pulse transitions (i.e., rising edges or falling edges) indicate a change in the value of the data bits 103 in the data signal 104. Accordingly, a decoder, upon receiving the transmission signal 106, can determine the clock period, with which to synchronize its own clock, and determine a data payload based on the pulses 108, 114, 120 in the transmission signal 106.

For example, the transmission signal 106 may include an initial pulse 105, having an initial width of 'w'. The initial pulse width may define the clock period. Following the initial pulse 105, the transmission signal 106 may be a low-level signal (i.e., '0'), labeled 107, for one clock cycle. Following the low-level signal 107, each transition from low ('0') to high ('1') may indicate a change in the value from the previous bit. In the example of FIG. 1, the transmission signal 106 remains low after the initial low-level clock cycle 107 for one more period, followed by a pulse 108, also lasting one clock period. The pulse 108 may have a rising edge 110 and a falling edge 112, each defining a change in the data bit value of the data signal. As the first data bit 103 is '0', the rising edge 110 after one clock cycle indicates a change in value from the previous bit (i.e., from '0' to '1'). Accordingly, the first two data bits are '01'. The pulse 108 after one additional clock cycle returns from '1' to '0', as indicated by falling edge 112, resulting in the first three data bits to be '010'.

The transmission signal 106, according to the example in FIG. 1 stays low ('0') for the next three clock cycles. Because there is no transition from low to high over those three clock cycles, those three bits all have the same value of '0'. Accordingly, the first five data bits are given as '01000'. Subsequently, the transmission signal 106 forms a second pulse 114. The rising edge 116 of the second pulse 114 indicates a change in value from the previous bit (i.e., from '0' to '1'). The transmission signal 106 remains at a high level for the next two clock cycles until the falling edge 118 of the second pulse 114 occurs. The second pulse 114 having a high-level for two clock cycles indicates the next two data bits are '1'. Accordingly, the first seven data bits are given as '0100011'.

Following the second pulse 114, as indicated by the falling edge 118, is a low-level signal for one cycle giving the eighth data bit as '0'. A rising edge 122 of a third pulse 120 indicates a change in the next data bit value to '1'. Because the third pulse 120 has a falling edge 124 after one clock cycle, a single data bit of '1' is given as the ninth bit. The transmission, in this example, may end after the ninth data bit. Accordingly, the transmission signal 106 may be encoded to carry both the clock period, 'w', and the nine-bit data payload of '010001101'.

Figure 2:
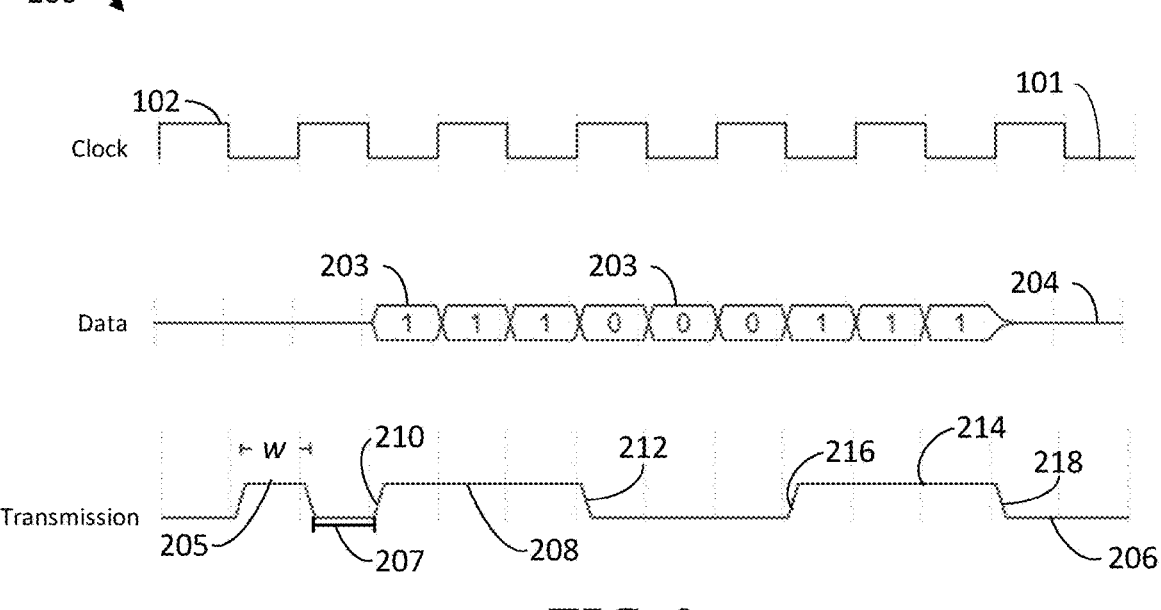
FIG. 2 is another timing diagram of a compact modulation protocol signal, according to aspects of the disclosure.
Figure 3:
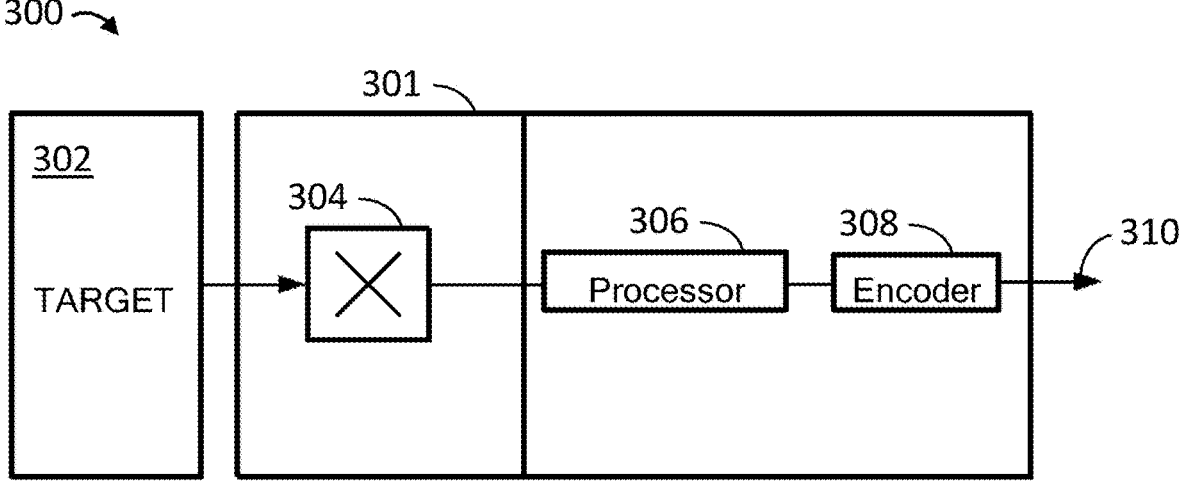
FIG. 3 shows a block diagram of a compact modulation protocol system, according to aspects of the disclosure.

FIG. 2 shows a timing diagram 200 with another example of a compact modulation protocol transmission signal 206. Like the example given above in connection with FIG. 1, the clock signal 101 may include a number of pulses 102 with widths defining a clock period. The data signal 204 may include a number of data bits, collectively labeled 203, that make up a data payload for inclusion in the transmission signal 206. For example, the data signal 204 of FIG. 1 may include a nine-bit data payload with a sequence of data bits: '111000111'.

According to one aspect, the compact modulation protocol may generate the transmission signal 206 to include an initial pulse 205 indicative of a clock frequency followed by a number of pulses, for example pulses 208 and 214 in which the pulse transitions (i.e., rising edges or falling edges) are indicative of a change in the value of the data bits from the data signal 204.

For example, the transmission signal 206 may include an initial pulse 205, having an initial width of 'w'. The initial pulse width may define the clock period. Following the initial pulse 205 may be a low-level signal (i.e., '0'), labeled 207, for one clock cycle. Following the low-level signal 107, a rising edge 210 of the first pulse 208 indicates the first data bit is '1'. The pulse 208 remains high for three clock cycles giving the first three data bits as '111'. A falling edge 212 of the first pulse 208 indicates a change in value for the fourth data bit. As the transmission signal 206 goes low for the next three clock cycles, the next three data bits are each '0', giving the first six data bits of the transmission signal as '111000'.

A second pulse 214 includes a rising edge 216 indicating a change in value for the seventh data bit. The second pulse 214 lasts three clock cycles until a falling edge 218 occurs. Accordingly, the next three data bits are '111' and the nine-bit string is given as '111000111'.

According to one aspect of the disclosure, transmission signals may be encoded using a compact modulation protocol according to the methods and steps previously described. According to one aspect, the compact modulation protocol may be implemented in a sensor application. FIG.

3 depicts a block diagram of a compact modulation protocol system 300. According to an exemplary implementation, a sensor 301 may be configured to encode and transmit information about a target 302 or other data source. The information to be transmitted may come from a sensing element 304 or the like. According to one aspect, the sensing element 304 may be configured to detect a magnetic field associated with proximity or movement of the target object 302, such as a gear, wheel or the like. The sensing element 304 may be a source of a data signal to be encoded and transmitted.

The sensor 301 may include at least one processor 306 configured to receive data from one or more sources, such as the sensing element 304. According to one aspect, the processor 306 may receive data from the sensing element 304 relating to a detected condition of the target 302, such as angular position. The processor 306 may calculate the angle from the sensing element 304 data and pass that data to an encoder 308. The encoder 308 may generate a transmission signal 310, as described herein, encoded with the angle data provided by the processor 306.

While the sensor 301 detailed above is described in connection with a sensing element 304 configured to detect an angular position, one skilled in the art will recognize that the sensor 301 may be any kind of sensor configured to monitor and/or obtain information about the target 302, including without limitation, current sensors, speed sensors, positional sensors, or the like, without deviating from the scope of the present disclosure.

Figure 4:
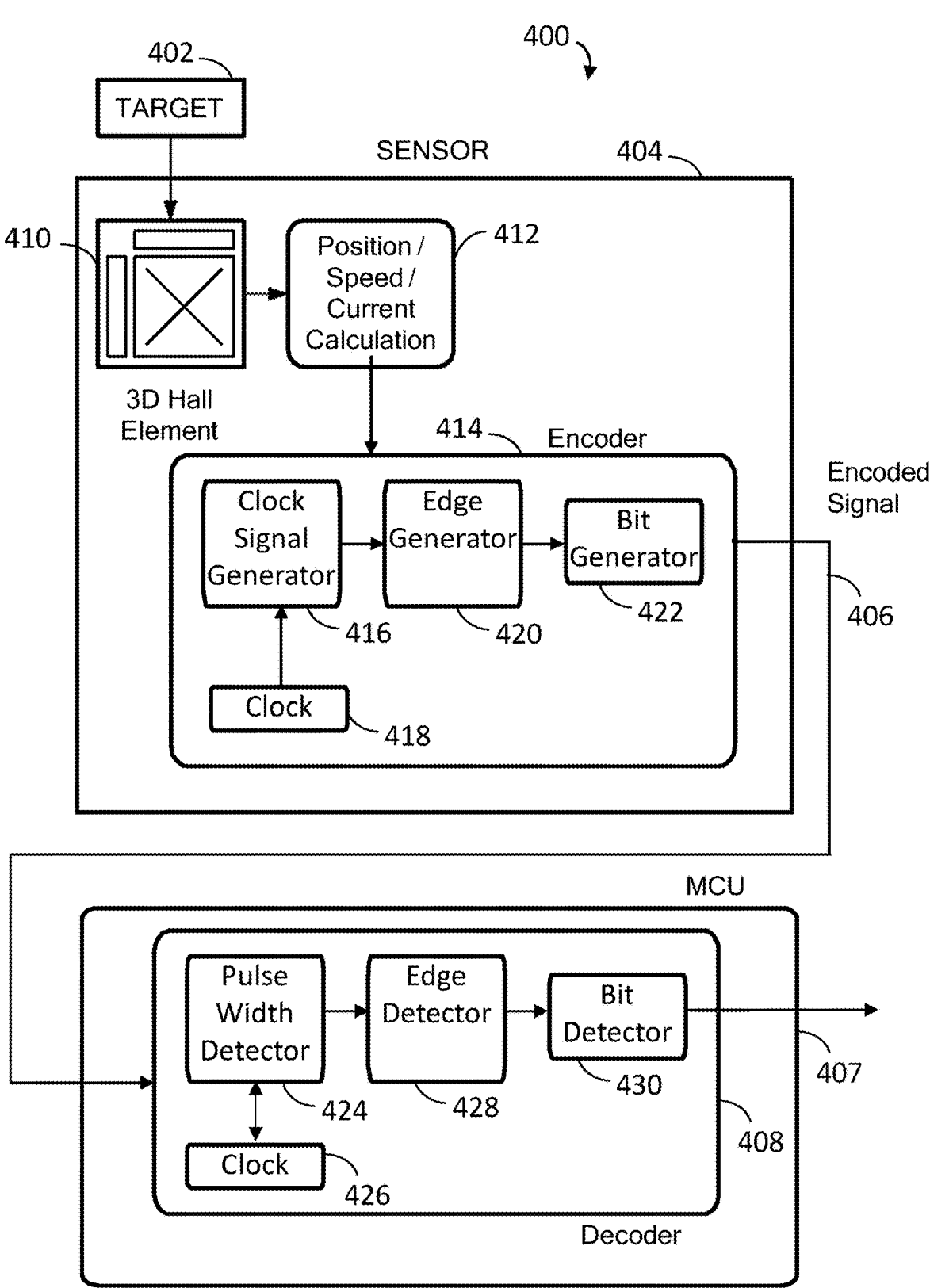
FIG. 4 shows a block diagram of a system for encoding and decoding a compact modulation protocol signal, according to aspects of the disclosure.

FIG. 4 is a block diagram of a system 400 for encoding and decoding a transmission signal using a compact modulation protocol. A target 402, such as a wheel, a gear, or the like, may be monitored by a sensor 404 and a transmission signal 406 may be generated carrying over a single line clock information and a data payload. According to one aspect, the system 400 may be configured to sense and transmit information relating to the target 402, including without limitation, a rotational angle of the target 402, a target speed, or current passing through the target 402.

According to one aspect, a magnetic field sensing element 410, such as a three-dimensional element, may detect a magnetic field associated with rotation of the target 402, or according to other illustrative aspects, a target speed or target current. As the target 402 rotates, magnetic field signals may be generated by the magnetic field sensing element 410 and an angle calculation processor 412 may use signals from the magnetic field sensing element 410 to determine the angular position of the target 402 at a given time. The determined angular position of the target 402 may be transmitted to an encoder 414 where the angular position data may be encoded into a transmission signal 406 as described herein.

The encoder 414 may include a clock signal generator 416 configured to generate one or more pulses related to a clock 418. As described herein, the clock signal generator 416 may obtain clock information from the clock 418 and encode a clock frequency into the transmission signal in the form of an initial pulse having a width indicative of the clock period. An edge generator 420 and a bit generator 422 may be configured to calculate and generate the pulses indicating the data payload as described herein. According to one aspect, a rising edge may be generated to indicate the previous bit was '0' and the current bit is '1', a falling edge may be generated to indicate the previous bit was '1' and the current bit is '0', and if the current bit value is to remain the same as the previous one, no edge will be generated. Alternatively, the polarities identified by the pulse edges may be reversed (i.e., a rising edge may be generated to indicate the previous bit was '1' and the current bit is '0' or a falling edge may be generated to indicate the previous bit was '0' and the current bit is '1'). The transmission signal 406 may then be transmitted to a receiver.

While aspects of the present disclosure detail the use of a magnetic sensing element to detect a magnetic field associated with the rotation of a target, one skilled in the art will appreciate that other sensing elements may be used without deviating from the scope of the disclosure. For example, the sensing element may also or instead be, without limitation, an inductive sensing element, a resistive sensing element, an optical sensing element, a pressure sensing element, a motor control element, a temperature sensing element or the like.

Once the transmission signal 406 is encoded, it may then be transmitted to a receiver, such as a microcontroller unit (MCU) 407 or the like, where the signal may be decoded to extract and properly process the data encoded therein. According to one aspect of the disclosure, the transmission signal may be decoded using similar methods to the encoding process. Given the similarities of the encoding and decoding processes described herein, the encoder and the decoder may advantageously include the same or similar hardware.

The data encoded in the transmission signal 406 may be received by a decoder 408. To accurately decode and process the data payload, the decoder 408 must decipher the timing information embedded in the transmission signal 406 and extract the data string from the remaining portions of the signal. The decoder 408 may include a pulse width detector 424, a decoder clock 426, an edge detector 428 and a bit detector 430. According to one aspect, the decoder 408 may receive the transmission signal 406 whereby the pulse width detector 424 may read and measure the width of the initial pulse of the transmission signal to determine the clock period. The decoder clock 426 may be updated with such information to synchronize its operations with the encoder clock 418 and allow accurate processing of the transmission signal. The edge detector 428 and the bit detector 430 may extract the data payload using the clock period, rising edges, falling edges, and pulse widths of the transmission signal.

According to one aspect, the pulse width detector 424 of the decoder 408 may measure the initial pulse width, 'w' of the transmission signal 406 and store that value as the decoder clock period. The decoder 408 may determine a time, $T_{RISE}$, until the next rising edge of the transmission signal. The decoder 408 may calculate a number of equal consecutive bit values, $N_{be}$ (i.e., the number of bits at the start of the payload having the same value of '0' or '1'). According to one aspect, a first sequence of consecutive equal bit values, $N_{be(1)}$ may be defined as:

$$N_{be(1)} = \text{round}\left(\frac{T_{RISE}}{w}\right);$$

where the quotient is rounded to a whole number.

The decoder 408 may determine the bit value of the initial data bit(s) based on the value of $N_{be(1)}$. For example, if $N_{be(1)} = 1$ after the initial pulse, then the first data bit value is '1'. If, on the other hand, $N_{be(1)} > 1$ after the initial pulse, then the first $N_{be(1)}$ bit values are '0'.

According to one aspect, after determining the value of the first bit and the number of consecutive bits having the same value, the clock period 'w', may be updated as:

$$w = \left(\frac{T_{RISE}}{N_{be(1)}}\right);$$

According to one aspect, updating the period 'w' in such a manner may ensure that the decoder clock 426 does not fall out of sync, particularly if a given pulse in the transmission signal 406 extends over a significant number of clock cycles. For example, if a data payload includes the same bit value over a long enough time (i.e., several clock cycles), there is no change to the level of the transmission signal and the decoder clock 406 may drift to such an extent that the decoding operation fails.

According to one aspect, to ensure the encoder 414 and the decoder 408 remain synchronized, particularly when transmitting large payloads having an extended sequence of consecutive equal bit values, a resynchronization bit pattern may be included, for example, in the middle of a payload. A maximum number of consecutive equal bit values that may be sent without needing to resynchronize may be defined as $$N_{be,max} < \frac{w \cdot \text{timing error}}{2}.$$

According to one aspect, for any data payload to be transmitted having more than $N_{be,max}$ bits of the same value, a resynchronization pattern may be inserted into the payload after the $N_{be,max}$ bit. According to one example, a resynchronization pattern may include a three-cycle pattern of a low clock cycle '0', followed by a high clock cycle '1', and ending with a low clock cycle '0'. The distinct pattern of the resynchronization pattern may ensure the decoder can accurately distinguish the resynchronization bits from the data bits.

As one, non-limiting example, if $N_{be,max}$=10 and a payload to be transmitted included thirteen consecutive '0' bits and one '1' bit (e.g. '00000000000001'), the resulting sequence of clock cycles may include ten clock cycles at '0', followed by the resynchronization pattern (e.g., one clock cycle at '0', one clock cycle at '1', one clock cycle at '0'), then three clock cycles at '0' (e.g., the remaining bits of the payload at '0'), followed by a transition to '1' for one cycle. Longer payloads may include multiple resynchronization patterns, as described above, throughout the payload. For example, if $N_{be,max}$=10 and an intended payload includes thirty-five consecutive bits having the same value, the resynchronization pattern may be included three times.

After updating the clock period 'w', the decoder 408 may measure or determine the time until the next transition, $T_{EDGE(1)}$, as indicated by either a rising edge or a falling edge. The next number of equal consecutive data bits, $N_{be(2)}$, may be determined as:

$$N_{be(2)} = \text{round}\left(\frac{T_{EDGE(1)}}{w}\right).$$

The bit value for the last $N_{be(2)}$ bits may be set to '1' if the transition at $T_{EDGE}$ is a rising edge. If the transition at $T_{EDGE}$ is a falling edge, the decoder may set the value of the last $N_{be(2)}$ bits to '0'. The clock period, 'w' may be updated again as:

$$w = \left(\frac{T_{EDGE(1)}}{N_{be(2)}}\right).$$

The decoder 408 may continue in this manner by determining the time until the next pulse edge, $T_{EDGE(n)}$, determining the next number of equal consecutive bit values, $N_{be(n)}$, and updating the clock period, 'w' until the transmission signal is fully decoded.

Figure 5:
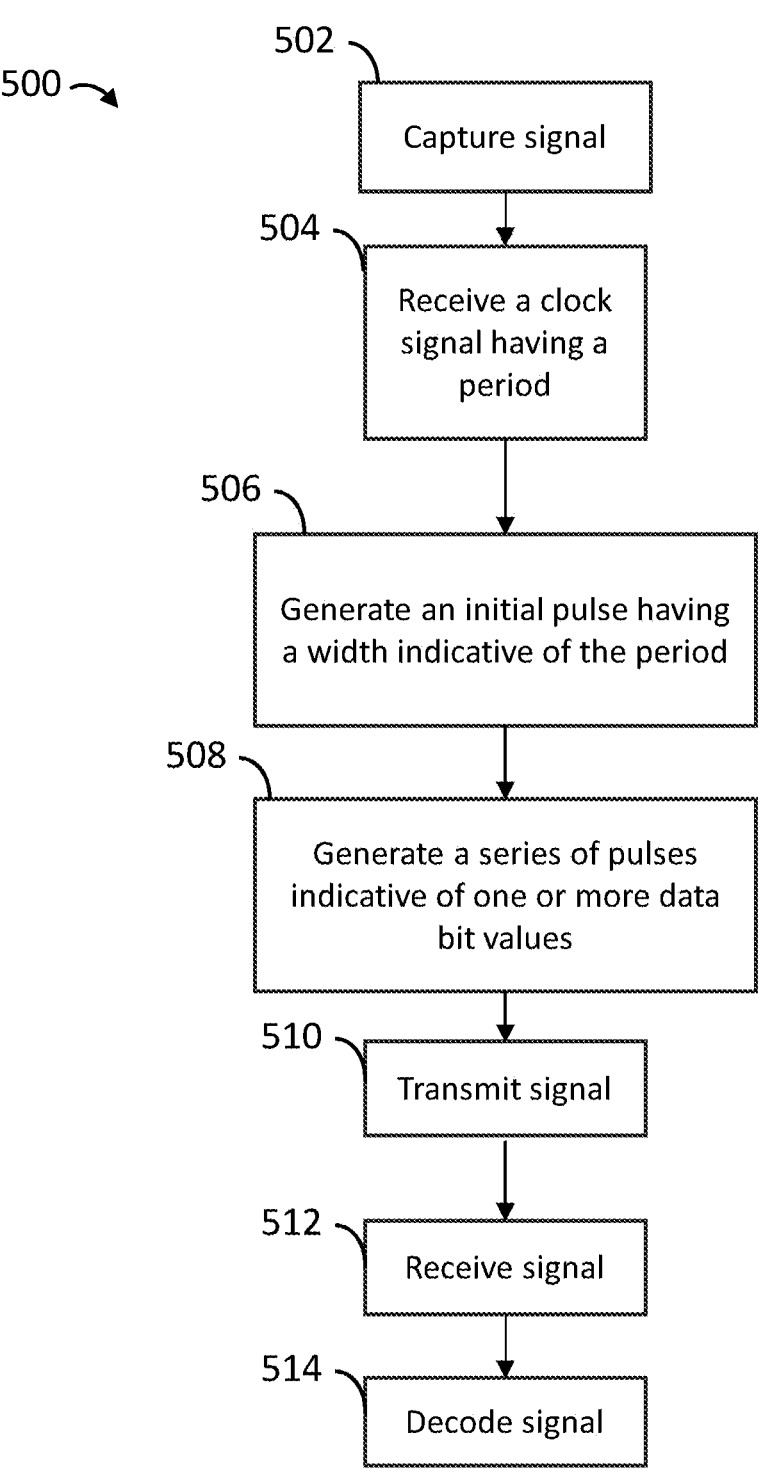
FIG. 5 is a flow diagram illustrating encoding and decoding of a transmission signal with a compact modulation protocol, according to aspects of the disclosure.

FIG. 5 is a flow diagram 500 illustrating encoding and decoding of a transmission signal with a compact modulation protocol, according to aspects of the disclosure. The compact modulation protocol may start, as shown in block 502, with obtaining or generating or capturing a signal. According to one exemplary implementation, the signal may be a sensor signal generated by a sensing element monitoring a target. The sensing element may be, for example, a position sensor, a speed sensor, a current sensor, or the like, configured to obtain information about the target. The captured signal from the sensor may include the target information and be encoded by an encoder. The encoder may receive both the sensor signal and, as shown in block 504, a clock signal. The clock signal may include or define a clock period whereby the encoder will associate each edge of the clock signal with a different data bit of the data signal obtained from the sensor. As shown in block 506, the encoder may use the clock signal to generate an initial pulse having a width indicative of the clock period.

At block 508, the encoder may generate a series of pulses indicative of the data obtained from the sensor. As described herein, each pulse may include a rising edge and a falling edge defining the pulse over one or more clock periods, where each transition of the signal indicates a change in data bit value. The data bit values over the span until the next signal transition may be equal. For example, a pulse lasting three clock periods at a high-level may indicate three consecutive values of '1', or '111'. Similarly, a low-level signal over three clock periods may indicate three consecutive '0' values, or '000'. Accordingly, the rising edges and the falling edges of the encoded transmission signal may be used to indicate the values of the data bits in relation to the previous bit. That is, a rising edge may indicate the previous bit was '0' and the current bit is '1', a falling edge may indicate the previous bit was '1' and the current bit is '0', and no transition in the signal indicates the current bit value is the same as the previous bit. According to an alternative implementation, the polarities may be reversed such that a rising edge indicates the previous bit was '1' and the current bit is '0' and a falling edge indicates the previous bit was '0' and the current bit is '1'.

Accordingly, the transmission signal is encoded with a first pulse having a width representative of the period of the clock signal followed one or more pulses having edge information indicative of a value of the data bit. According to one aspect, the edge information may include a presence of a rising edge, a presence of a falling edge, or an absence of an edge.

When the entire data payload is encoded in the pulses of the transmission signal, as shown in block 510, the transmission signal may be transmitted. As shown in block 512, an MCU with a decoder configured to extract the data payload may receive the transmission signal. As shown in block 514, the decoder may decode the signal to extract clock information and the data payload, as described herein.

Figure 6:
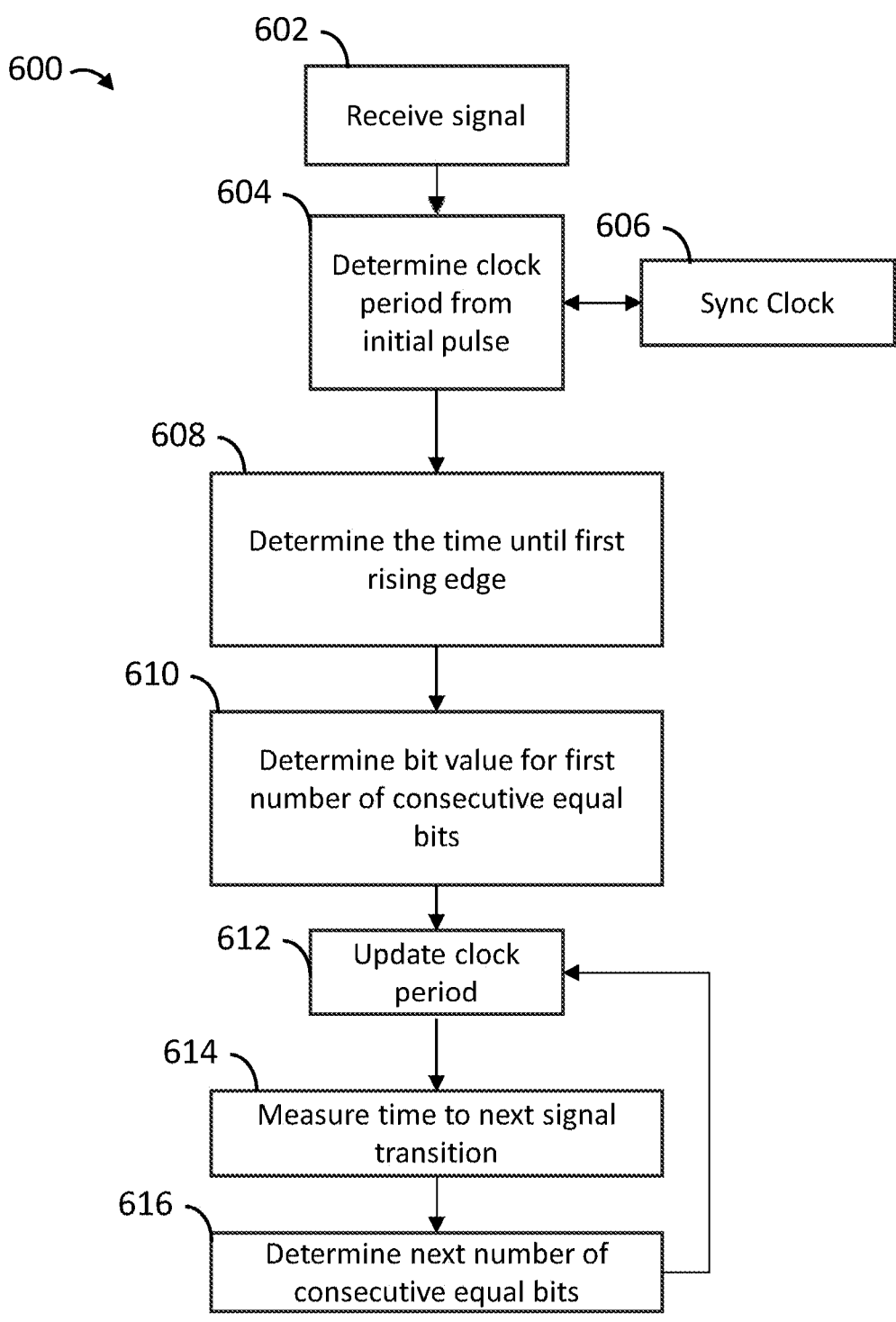
FIG. 6 a is a flow diagram illustrating decoding of a transmission signal with a compact modulation protocol, according to aspects of the disclosure.

FIG. 6 is a flow diagram illustrating a method 600 of decoding of a transmission signal with a compact modulation protocol, according to aspects of the disclosure. As shown in block 602, the transmission signal may be received by an MCU, or the like, with a decoder configured to extract clock information and a data payload. In block 604, the decoder may measure the width of the initial pulse of the signal. The width of the initial pulse may indicate the clock period from the encoder. The decoder may store the period and generate a decoder clock signal according to the period. As shown in block 606, the decoder clock may be synchronized according to the period indicated by the first pulse width.

With a synchronized decoder clock, as shown in block 608, the decoder may determine from the transmission signal a first time interval from the first pulse until the first rising edge. The decoder may calculate a first number of equal consecutive bit values (i.e., the number of initial consecutive bits having the same value) by dividing the first time interval by the period. The quotient may be rounded to a whole number to represent the number of equal consecutive bit values. From the period and the time until the first rising edge, as shown in block 610 and described herein, the decoder may determine the bit value for the first number of consecutive equal bits (i.e., whether the first bit and subsequent bits of equal value are '1' or '0'). According to one aspect, if the quotient is equal to one, the bit values for the number of consecutive equal bits is '1'. Conversely, if the quotient is greater than one, the bit values for the number of consecutive equal bits is '0'.

Following the determination of the first number of consecutive bit values and the value of those bits, as shown in block 612, the clock period may be updated as described herein to account for any unacceptable drift caused by an extended sequence of bits having the same value over several clock periods. That is, the updated clock period may be calculated as the time to the first rising edge divided by the first number of consecutive equal bits. As described above, any payload including more than a maximum number of equal consecutive bit values, may have a resynchronization pattern included in the payload (e.g., a three clock cycle pattern of '0', '1', '0') following the clock cycle of the $N_{be,max}$ bit.

After updating the clock period, shown in block 614, the decoder may determine a second time interval by measuring the time until the next or proximate signal transition, either a rising edge or a falling edge. From this time interval and the updated clock period, as shown in block 616, the decoder may determine the next number of equal consecutive equal bits, as described herein (i.e., dividing the time to the next edge by the updated clock period). According to one aspect, the next number of consecutive bits may be '1' if the previous signal transition was a rising edge or may be '0' if the previous signal transition was a falling edge. The method 600 may repeat the steps shown in blocks 612 through 616 for each subsequent pulse in the transmission signal until the end of the signal is reached.

In this manner, a compact modulation protocol may generate, encode, and/or decode a transmission signal that is self-clocking and utilizes the full bit rate to capture information on every clock transition, as opposed to every second transition. The self-clocking capability of the protocol allows the transmission signal to be transmitted over a single line. Further, given the similar methods and complexity of encoding and decoding the transmission signal according to the described protocol, the encoder and decoder may include the same or similar hardware.

The detailed description set forth above, in connection with the appended drawings, is intended as a description of various configurations and is not intended to represent the only configurations in which the concepts described herein may be practiced. The detailed description includes specific details for providing a thorough understanding of the various concepts. It will be apparent to those skilled in the art, however, that these concepts may be practiced without these specific details. In some instances, well-known structures and components are shown in block diagram form in order to avoid obscuring such concepts.

As used herein, the terms "processor" and "controller" are used to describe elements that perform a function, an operation, or a sequence of operations. The function, operation, or sequence of operations can be hard coded into an electronic circuit or soft coded by way of instructions held in a memory device. The function, operation, or sequence of operations can be performed using digital values or using analog signals. In some embodiments, the processor or controller can be embodied in an application specific integrated circuit (ASIC), which can be an analog ASIC or a digital ASIC, in a microprocessor with associated program memory, in a discrete electronic circuit which can be analog or digital, and/or in special purpose logic circuitry (e.g., a field programmable gate array (FPGA)). Processing can be implemented in hardware, software, or a combination of the two. Processing can be implemented using computer programs executed on programmable computers/machines that include one or more processors, a storage medium or other article of manufacture that is readable by the processor (including volatile and non-volatile memory and/or storage elements), at least one input device and one or more output devices. Program code can be applied to data entered using an input device to perform processing and to generate output information. A processor or controller can contain internal processors or modules that perform portions of the function, operation, or sequence of operations. Similarly, a module can contain internal processors or internal modules that perform portions of the function, operation, or sequence of operations of the module.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

As used herein, the term "magnetic field sensor" or simply "sensor" is used to describe a circuit that uses one or more magnetic field sensing elements, generally in combination with other circuits. The magnetic field sensor can be, for example, a rotation detector, a movement detector, or a proximity detector. A rotation detector (or movement detector) can sense passing target objects, for example, magnetic domains of a ring magnet or a ferromagnetic target (e.g., gear teeth) where the magnetic field sensor is used in combination with a back-bias or other magnet and can determine target movement speed. Ferromagnetic objects described herein can have a variety of forms, including, but not limited to, a ring magnet having one or more pole pair, and a gear having two or more gear teeth. Ferromagnetic gears are used in some examples below to show a rotating ferromagnetic object having ferromagnetic features, i.e., teeth. However, in other embodiments, the gear can be replaced with a ring magnet having at least one pole pair. Also, linear arrangements of ferromagnetic objects are possible that move linearly.

As used herein, the term "magnetic field sensing element" is used to describe a variety of electronic elements that can sense a magnetic field. The magnetic field sensing element can be, but is not limited to, a Hall effect element, a magnetoresistance element, a magnetotransistor, or an inductive coil. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate or in the plane of the substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of maximum sensitivity perpendicular to a substrate, while metal based or metallic magnetoresistance elements (e.g., GMR, TMR, AMR) and vertical Hall elements tend to have axes of maximum sensitivity parallel to a substrate.

As used herein, the term "magnetic field signal" is used to describe any signal that results from a magnetic field experienced by a magnetic field sensing element.

It is noted that various connections and positional relationships (e.g., over, below, adjacent, etc.) may be used to describe elements and components in the description and drawings. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship.

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture, or an article, that includes a list of elements is not necessarily limited to only those elements but can include other elements not expressly listed or inherent to such apparatus, method, composition, mixture, or article.

References in the specification to "embodiments," "one embodiment," "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it may affect such feature, structure, or characteristic in other embodiments whether explicitly described or not.

Use of ordinal terms such as "first," "second," "third," etc., in the claims to modify a claim element does not by itself connote any priority, precedence, or order of one claim element over another, or a temporal order in which acts of a method are performed, but are used merely as labels to distinguish one claim element having a certain name from another element having a same name (but for use of the ordinal term) to distinguish the claim elements.

In the foregoing detailed description, various features of embodiments are grouped together in one or more individual embodiments for the purpose of streamlining the disclosure. This method of disclosure is not to be interpreted as reflecting an intention that the claims require more features than are expressly recited therein. Rather, inventive aspects may lie in less than all features of each disclosed embodiment.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

Having described implementations which serve to illustrate various concepts, structures, and techniques which are the subject of this disclosure, it will now become apparent to those of ordinary skill in the art that other implementations incorporating these concepts, structures, and techniques may be used. Accordingly, it is submitted that that scope of the patent should not be limited to the described implementations but rather should be limited only by the spirit and scope of the following claims.

What is claimed is:

1. An apparatus comprising:
a clock signal generator configured to generate a clock signal having a period; and
a processor responsive to the clock signal generator and configured to generate an encoded signal comprising a first pulse having a width representative of the period of the clock signal followed by data bits, wherein each edge of the clock signal is associated with a different data bit and wherein the encoded signal comprises edge information indicative of a value of the data bit; and
a decoder operable to decode the encoded signal to determine the value of each data bit, wherein the decoder is configured to:
measure the width of the first pulse,
store a period of a decoder clock signal represented by the width of the first pulse,
determine a first time interval from the first pulse to a first rising edge following the first pulse;
calculate a first number of equal consecutive bit values by dividing the first time interval by the period to determine a quotient:
determine a first bit value of one for each of the first number of equal consecutive bit values if the quotient is equal to one;
determine the first bit value of zero for each of the first number of equal consecutive bit values if the quotient is greater than one;

determine a first updated period of the decoder clock signal based on a time of the first rising edge and the first number of consecutive bit values;

determine a second time interval from an end of the first time interval to a proximate signal edge;

calculate a second number of equal consecutive bit values by dividing the second time interval by the first updated period of the decoder clock signal;

determine a second bit value of one for each of the second number of equal consecutive bit values if a prior transition was a rising edge;

determine the second bit value of zero for each of the second number of equal consecutive bit values if the prior transition was a falling edge; and generate a second updated period based on the time of the proximate signal edge and the second number of consecutive bit values.

2. The apparatus of claim 1 wherein the encoded signal is at a low level after the first pulse and before the data bits.

3. The apparatus of claim 1 wherein the edge information comprises a presence of the rising edge, a presence of the falling edge, or an absence of an edge.

4. The apparatus of claim 3 wherein the presence of the rising edge is indicative of a first change in the value of a data bit from a first value to a second value.

5. The apparatus of claim 4 wherein the presence of the falling edge is indicative of a second change in the value of a data bit from the second value to the first value.

6. The apparatus of claim 5 wherein the first value is '0' and the second value is '1'.

7. The apparatus of claim 3 wherein the absence of an edge is indicative of a first bit and a second, consecutive bit having the same value.

8. The apparatus of claim 1 further comprising at least one sensing element operable to generate and transmit at least one sensor signal to the processor.

9. The apparatus of claim 8 wherein the at least one sensing element comprises one or more of a magnetic field sensing element, an inductive sensing element, a resistive sensing element, an optical sensing element, a pressure sensing element, a motor control element, or a temperature sensing element.

10. The apparatus of claim 9 wherein the at least one sensing element comprises a magnetic field sensing element operable to generate the at least one sensor signal, wherein the at least one sensor signal is indicative of a magnetic field associated with an object.

11. The apparatus of claim 1 wherein the first updated period is determined by dividing the time of the first rising edge by the first number of consecutive bit values.

12. The apparatus of claim 1 wherein the second updated period is determined by dividing the time of the proximate signal edge by the second number of consecutive bit values.

13. A method of communicating a signal, the method comprising:

receiving a clock signal having a period;

receiving a data signal including data bits;

generating an encoded signal comprising a first pulse having a width representative of the period of the clock signal followed by one or more subsequent pulses representative of the data bits, wherein each edge of the clock signal is associated with a different data bit and wherein the one or more subsequent pulses comprise edge information indicative of a value of the data bit; and decoding the encoded signal to determine the value of each data bit, wherein the decoding includes:

measuring the width of the first pulse;

storing a period of a decoder clock signal represented by the width of the first pulse;

determining a first time interval from the first pulse to a first rising edge following the first pulse;

calculating a first number of equal consecutive bit values by dividing the first time interval by the period to determine a quotient;

determining a first bit value of one for each of the first number of equal consecutive bit values if the quotient is equal to one;

determining the first bit value of zero for each of the first number of equal consecutive bit values if the quotient is greater than one;

determining a first updated period of the decoder clock signal based on a time of the first rising edge and the first number of consecutive bit values;

determining a second time interval from an end of the first time interval to a proximate signal edge;

calculating a second number of equal consecutive bit values by dividing the second time interval by the first updated period of the decoder clock signal;

determining a second bit value of one for each of the second number of equal consecutive bit values if a prior transition was a rising edge, determining the second bit value of zero for each of the second number of equal consecutive bit values if the prior transition was a falling edge; and generating a second updated period based on the time of the proximate signal edge and the second number of consecutive bit values.

14. The method of claim 13 wherein the encoded signal is at a low level after the first pulse and before the data bits.

15. The method of claim 13 wherein the edge information comprises a presence of the rising edge, a presence of the falling edge, or an absence of an edge.

16. The method of claim 15 wherein the presence of the rising edge is indicative of a first change in the value of a data bit from a first value to a second value.

17. The method of claim 16 wherein the presence of the falling edge is indicative of a second change in the value of a data bit from the second value to the first value.

18. The method of claim 17 wherein the first value is '0' and the second value is '1'.

19. The method of claim 15 wherein the absence of an edge is indicative of a first bit and a second, consecutive bit having the same value.

20. The method of claim 13 further comprising receiving at least one sensor signal from at least one sensing element operable to generate and transmit at least one sensor representing the data signal.

21. The method of claim 13 wherein the first updated period is determined by dividing the time of the first rising edge by the first number of consecutive bit values.

22. The method of claim 13 wherein the second updated period is determined by dividing the time of the proximate signal edge by the second number of consecutive bit values.

23. A decoding apparatus comprising:

a clock; and a processor responsive to the clock and configured to receive an encoded signal comprising a first pulse followed by one or more subsequent pulses, wherein the processor is further configured to decode the encoded signal by:

measuring a width of the first pulse of the encoded signal;

storing the width of the first pulse as a decoder clock period;

determining a first time interval from the first pulse to a first rising edge following the first pulse;

calculating a first number of equal consecutive bit values by dividing the first time interval by the decoder clock period to determine a quotient;

determining a first bit value of one for each of the first number of equal consecutive bit values if the quotient is equal to one;

determining the first bit value of zero for each of the first number of equal consecutive bit values if the quotient is greater than one;

determining a first updated period of the decoder clock period based on a time of the first rising edge and the first number of consecutive bit values;

determining a second time interval from an end of the first time interval to a proximate signal edge;

calculating a second number of equal consecutive bit values by dividing the second time interval by the first updated period of the of the-decoder clock period;

determining a second bit value of one for each of the second number of equal consecutive bit values if a prior transition was a rising edge;

determining the second bit value of zero for each of the second number of equal consecutive bit values if the prior transition was a falling edge; and generating a second updated period based on the time of the proximate signal edge and the second number of consecutive bit values.

24. The decoding apparatus of claim 23 wherein the first updated period is determined by dividing the time of the first rising edge by the first number of consecutive bit values.

25. The decoding apparatus of claim 23 wherein the second updated period is determined by dividing the time of the proximate signal edge by the second number of consecutive bit values.

* * * * *